United States Patent
Jiang et al.

(10) Patent No.: US 7,170,377 B2
(45) Date of Patent: Jan. 30, 2007

(54) SUPERCONDUCTIVE MAGNET INCLUDING A CRYOCOOLER COLDHEAD

(75) Inventors: Longzhi Jiang, Florence, SC (US);
Gregory Alan Lehmann, Florence, SC (US); Edwin Lawrence Legall, Florence, SC (US)

(73) Assignee: General Electric Company, Schenectady, NY (US)

( * ) Notice: Subject to any disclaimer, the term of this patent is extended or adjusted under 35 U.S.C. 154(b) by 247 days.

(21) Appl. No.: 10/710,682

(22) Filed: Jul. 28, 2004

(65) Prior Publication Data

US 2006/0022779 A1      Feb. 2, 2006

(51) Int. Cl.
*F25B 19/00*   (2006.01)
*H01F 5/00*    (2006.01)

(52) U.S. Cl. .............. 335/216; 335/300; 324/318; 62/51.1

(58) Field of Classification Search ............... 335/216; 324/318–320; 62/51.1
See application file for complete search history.

(56) References Cited

U.S. PATENT DOCUMENTS

| | | | |
|---|---|---|---|
| 4,223,540 A * | 9/1980 | Longsworth | ........ 62/51.1 |
| 4,667,487 A | 5/1987 | Miller et al. | |
| 5,132,618 A * | 7/1992 | Sugimoto | ........ 324/318 |
| 5,563,566 A | 10/1996 | Laskaris et al. | |
| 5,936,499 A | 8/1999 | Eckels | |
| 6,181,228 B1 | 1/2001 | Laskaris et al. | |
| 6,708,503 B1 | 3/2004 | Wang et al. | |

* cited by examiner

*Primary Examiner*—Ramon M. Barrera
(74) *Attorney, Agent, or Firm*—Cantor Colburn LLP

(57) ABSTRACT

A zero boiloff cryogen cooled recondensing superconducting magnet assembly including superconducting magnet coils suitable for magnetic resonance imaging including a cryogen pressure vessel to contain a liquid cryogen reservoir to provide cryogenic temperatures to the magnet coils for superconducting operation; a vacuum vessel surrounding the pressure vessel and spaced therefrom; a first thermal shield surrounding and spaced from the pressure vessel; a second thermal shield surrounding and spaced from the first thermal shield and intermediate the vacuum vessel and the first shield; a cryocooler thermally connected by a first and a second thermal interface to the first and second thermal shields, respectively; a recondenser positioned in the space between the pressure vessel and the first thermal shield and thermally connected by a thermal interface to the cryocooler to recondense, back to liquid, cryogen gas provided from the pressure vessel; and means for returning the recondensed liquid cryogen the pressure vessel; wherein the second thermal shield surrounding the first thermal shield reduces a radiation heat load from the first thermal shield to the pressure vessel lowering boiloff of cryogen gas under conditions of failure or power off of the cryocooler.

24 Claims, 3 Drawing Sheets

FIG. 4
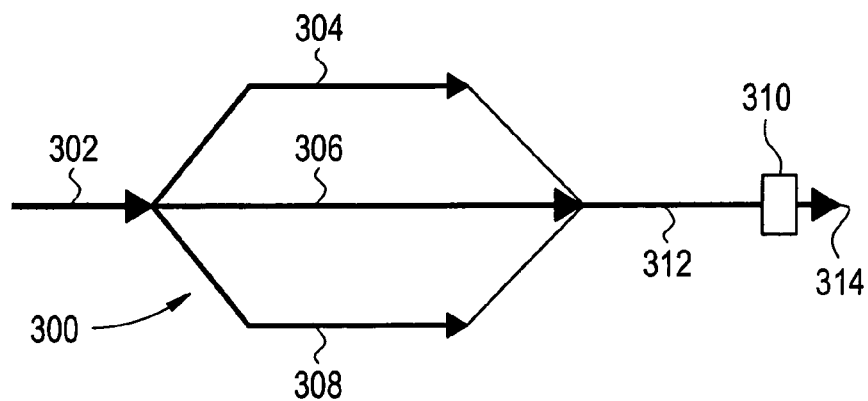
FIG. 5
FIG. 6
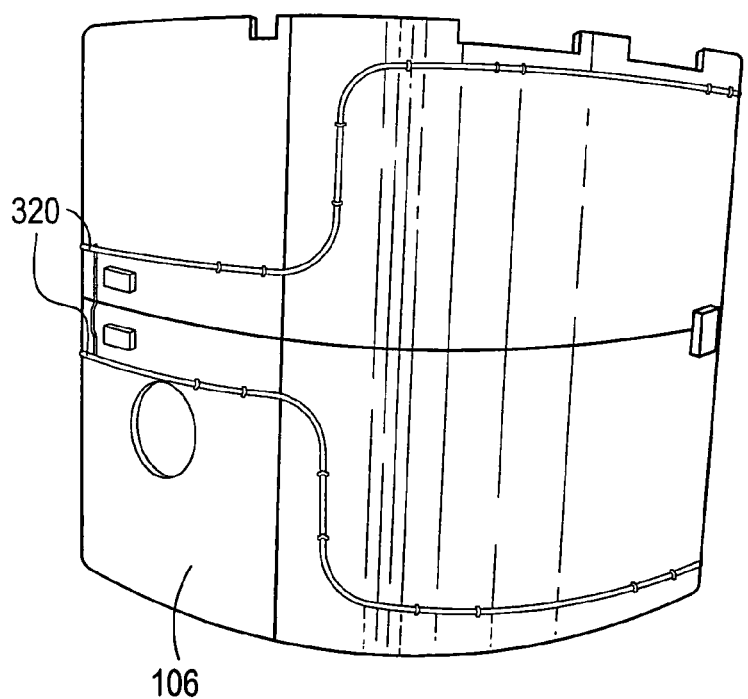

SUPERCONDUCTIVE MAGNET INCLUDING A CRYOCOOLER COLDHEAD

BACKGROUND OF THE INVENTION

The present disclosure relates generally to superconductive magnets, and more particularly to a superconductive magnet having a cryocooler coldhead.

Magnets include resistive and superconductive magnets which are part of a magnetic resonance imaging (MRI) system used in various applications such as medical diagnostics. Known superconductive magnets include liquid-helium-cooled, cryocooler-cooled, and hybrid-cooled superconductive magnets. Typically, the superconductive coil assembly includes a superconductive main coil surrounded by a thermal shield surrounded by a vacuum enclosure. A cryocooler-cooled magnet typically also includes a cryocooler coldhead externally mounted to the vacuum enclosure, having its first stage in solid conduction thermal contact with the thermal shield, and having its second stage in solid conduction thermal contact with the superconductive main coil. A liquid-helium-cooled magnet typically also includes a liquid-helium vessel surrounding the superconductive main coil with the thermal shield surrounding the liquid-helium vessel. A hybrid-cooled magnet uses both liquid helium (or other liquid or gaseous cryogen) and a cryocooler coldhead, and includes designs wherein the first stage of the cryocooler coldhead is in solid conduction thermal contact with the thermal shield and wherein the second stage of the cryocooler coldhead penetrates the liquid-helium vessel to recondense "boiled-off" helium. Superconducting magnets which recondense the helium gas back to liquid helium are often referred to as zero boiloff (ZBO) magnets.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a constant magnetic field of high uniformity within a typically spherical imaging volume centered within the magnet's bore where the object to be imaged is placed.

Open magnets, including "C" shape and support-post magnets, typically employ two spaced-apart coil assemblies with the space between the assemblies containing the imaging volume and allowing for access by medical personnel for surgery or other medical procedures during magnetic resonance imaging. The open space helps the patient overcome any feelings of claustrophobia that may be experienced in a closed magnet design.

Cryogens such as liquid helium, however, are not abundant and therefore can significantly impact the cost of operation of the MRI system. As a result, a zero boil-off design has far better advantage over a lower boil-off design, since the former design consumes no helium during normal operation. In the current zero boil-off magnet design, the magnet assembly only has a single radiation thermal shield which is wrapped by multiple layers of superinsulation. A temperature on the thermal shield, depending on the thermal shield conductance thereof, is about 45° K. to 70° K. The radiation heat load from the thermal shield to the helium vessel attributes to 50% of the total head load.

However, when the cryocooler coldhead extending through a penetration to the liquid-helium vessel is not operational due to power off, coldhead failure or transportation, the coldhead acts as a heat source and adds significant heat into the cryostat. The temperature on the single radiation thermal shield on such a zero boil-off design will climb up to about 100° K. to about 150° K. The increase in temperature depends on the thermal shield conductance, conductance of copper braids between a coldhead sleeve assembly and the thermal shield, and the radiation heat between the coldhead and the helium vessel, which attributes to most of the total head load and thus boil-off of the helium at a rate of about 1.4 liter/w.

Accordingly, there is need in the art for an apparatus and method to reduce radiation heat load between the thermal shield and the helium vessel, conduction heat from the coldhead to the thermal shield, and conduction heat load between the penetration and the thermal shield when the coldhead is not operational.

BRIEF DESCRIPTION OF THE INVENTION

Embodiments of the invention provide for a zero boiloff cryogen cooled recondensing superconducting magnet assembly including superconducting magnet coils suitable for magnetic resonance imaging including a cryogen pressure vessel to contain a liquid cryogen reservoir to provide cryogenic temperatures to the magnet coils for superconducting operation; a vacuum vessel surrounding the pressure vessel and spaced therefrom; a first thermal shield surrounding and spaced from the pressure vessel; a second thermal shield surrounding and spaced from the first thermal shield and intermediate the vacuum vessel and the first shield; a cryocooler thermally connected by a first and a second thermal interface to the first and second thermal shields, respectively; a recondenser positioned in the space between the pressure vessel and the first thermal shield and thermally connected by a thermal interface to the cryocooler to recondense, back to liquid, cryogen gas provided from the pressure vessel; and means for returning the recondensed liquid cryogen the pressure vessel; wherein the second thermal shield surrounding the first thermal shield reduces a radiation heat load from the first thermal shield to the pressure vessel lowering boiloff of cryogen gas under conditions of failure or power off of the cryocooler.

Further embodiments of the invention provide a method to reduce boiloff rate of cryogen gas during a coldhead failure or power off condition in a zero boiloff cryogen cooled recondensing superconducting magnet assembly including superconducting magnet coils suitable for magnetic resonance imaging. The method includes disposing a liquid cryogen in a cryogen pressure vessel to provide cryogenic temperatures to the magnet coils for superconducting operation; surrounding the pressure vessel with a vacuum vessel spaced from the pressure vessel; surrounding the pressure vessel with a first thermal shield spaced from the pressure vessel; surrounding the first thermal shield with a second thermal shield spaced from the first thermal shield, the second thermal shield intermediate the vacuum vessel and the first shield; thermally connecting a cryocooler by a first and a second thermal interface to the first and second thermal shields, respectively; positioning a recondenser in the space between the pressure vessel and the first thermal shield and thermally connected by a thermal interface to the cryocooler to recondense, back to liquid, cryogen gas provided from the pressure vessel; and returning the recondensed liquid cryogen to the pressure vessel; wherein the second thermal shield surrounding the first thermal shield reduces a radiation heat load from the first thermal shield to the pressure vessel lowering boiloff of cryogen gas under conditions of failure or power off of the cryocooler.

Yet another embodiment of the invention provides for a zero boiloff liquid helium cooled recondensing superconducting magnet assembly suitable for magnetic resonance imaging including a helium pressure vessel to contain a liquid helium reservoir to provide cryogenic temperatures to the magnet resonance imaging magnet assembly for superconducting operation; a vacuum vessel surrounding the pressure vessel and spaced from the pressure vessel; a first thermal shield surrounding the pressure vessel and spaced from the pressure vessel; a second thermal shield surrounding the first thermal shield and spaced from the first thermal shield, the second thermal shield intermediate the vacuum vessel and the first shield; and a recondenser and a cryocooler for cooling the recondenser to recondense helium gas formed in the pressure vessel back to liquid helium, the cryocooler thermally connected by a first and a second thermal interface to the first and second thermal shields, respectively; wherein the second thermal shield surrounding the first thermal shield reduces a radiation heat load from the first thermal shield to the pressure vessel lowering boiloff of helium gas under conditions of failure or power off of the cryocooler.

BRIEF DESCRIPTION OF THE DRAWINGS

Referring to the exemplary drawings wherein like elements are numbered alike in the accompanying Figures:

FIG. 4 depicts a plumbing system employed with helium gas exhaust from a helium bath that passes through tubing disposed with respect to the plurality of radiation thermal shields, coldhead sleeves associated with the double and three stage coldheads, and thermally isolated penetration in accordance with an exemplary embodiment;

FIG. 5 depicts one of the plurality of radiation thermal shields having copper tubing disposed on a circumferential periphery to cool the shields with sensible heat from the helium gas exhausted therethrough; and FIG. 6 depicts copper tubing mounted on an outer surface defining the coldhead sleeve to cool the sleeve with sensible heat from the helium gas exhausted therethrough.

DETAILED DESCRIPTION OF THE INVENTION

Figure 1:
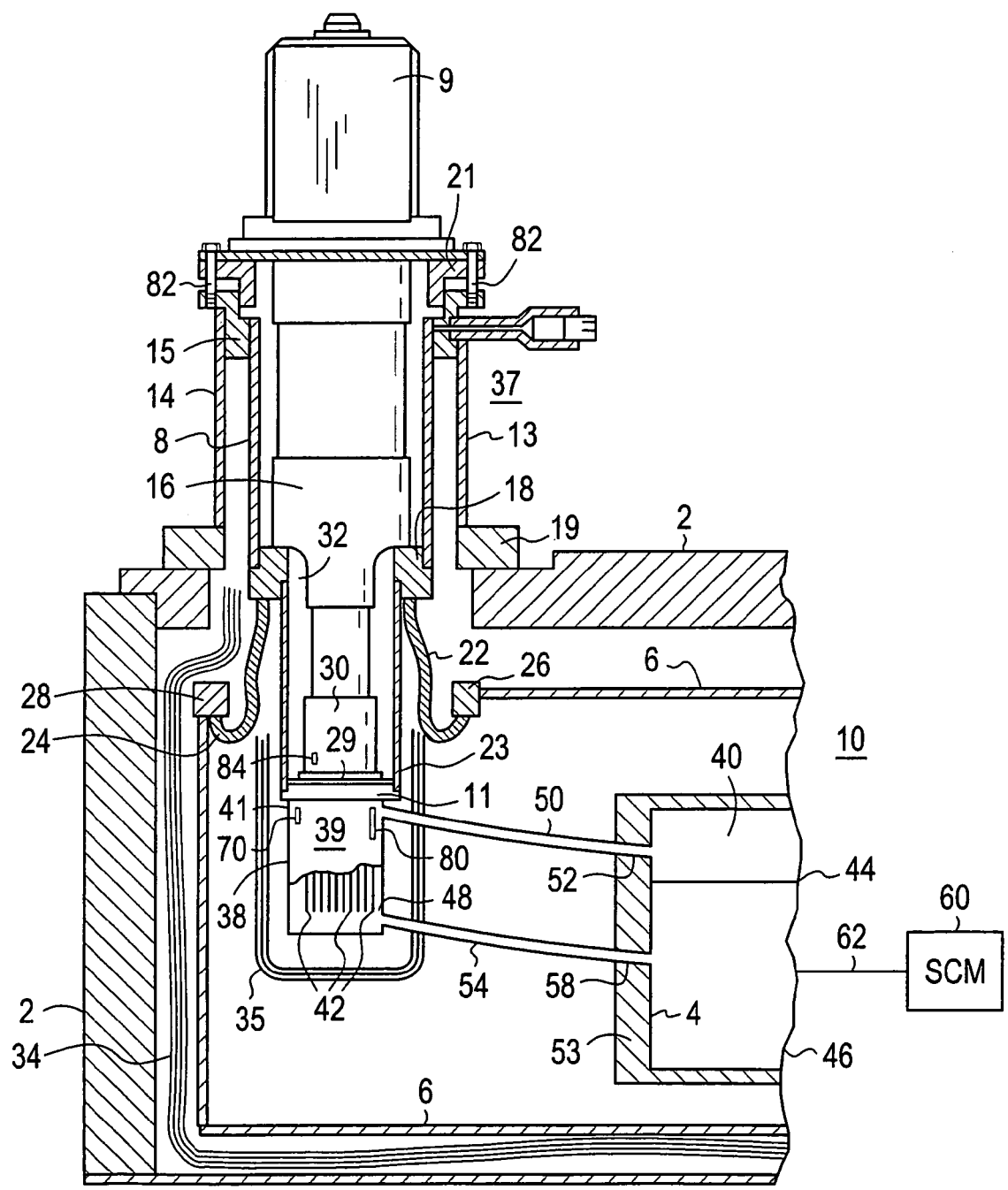
FIG. 1 is a cross section view of a portion of a MRI superconducting magnet having a conventional single radiation thermal shield.

Referring first to FIG. 1, a current MRI magnet system 10 includes helium pressure vessel 4 including a liquid cryogen such as helium surrounded by vacuum vessel 2 with thermally isolating radiation shield 6 interposed between the helium vessel and the vacuum vessel. A cryocooler 12 (which may be a Gifford-Mahon cryocooler) extends through vacuum vessel 2 within sleeve 8 such that the cold end of the cryocooler may be selectively positioned within the sleeve without destroying the vacuum within vacuum vessel 2, and heat generated by motor 9 of the cryocooler is outside the vacuum vessel. External cryocooler sleeve ring 14 extends outside vacuum vessel 2, and collar 19 and sleeve flange 15 enable the securing of outer cryocooler sleeve 13 to vacuum vessel 2. Cryocooler 12 is installed in the cryocooler sleeve assembly 8, 18, 23 with matching transition flange 21 and secured with bolts 82 and associated washers.

First stage heat station 16 of cryocooler 12 contacts copper first stage thermal sleeve or heat sink 18 which is thermally connected through braided copper flexible thermal couplings 22 and 24 and copper thermal blocks 26 and 28 on isolating radiation shield 6 to cool the radiation shield to a temperature of approximately 60° K. providing thermal isolation between helium vessel 4 and vacuum vessel 2. Flexible couplings 22 and 24 also provide mechanical or vibration isolation between cryocooler 12 and radiation shield 6.

The bottom surface of second stage heat station 30 of cryocooler 12 contacts indium gasket 29 to efficiently provide a temperature of 4° K. to heat sink 11 positioned on the opposite side of the indium gasket. Indium gasket 29 provides good thermal contact between the cryocooler heat station 30 and heat sink 11.

Extending below, and thermally connected to, heat sink 11 is helium recondensing chamber 38, made of high thermal conductivity material such as copper, which includes a plurality of substantially parallel heat transfer plates or surfaces 42 in thermal contact with heat sink 11 and forming passages between the surfaces of the plates for the passage of helium gas from helium pressure vessel 4.

Helium gas 40 forms above liquid helium surface level 44 of liquid helium supply 46 through the boiling of the liquid helium in providing cryogenic temperatures to MRI magnet system 10. Helium gas 40 passes through gas passageway 52, through the wall 53 of helium vessel 4, and through helium gas passage 50 to the interior of the upper portion 41 of helium recondensing chamber or canister 38. Heat transfer plates 42 within a recondenser 39 are cooled to 4° K. by second stage 30 of cryocooler 12, such that helium gas 40 passing between the plates recondenses into liquid helium to collect in bottom region 48 of helium recondensing chamber 38. The recondensed liquid helium then flows by gravity through helium return line 54 and liquid helium passage 58 in helium vessel 4 back to liquid helium supply 46, it being noted that helium recondensing chamber 38 is positioned higher than liquid helium passageway 58 in helium vessel 4.

As a result, during operation of MRI magnet system 10 liquid helium 46 cools superconducting magnet coil assembly (shown generally as 60) to a superconducting temperature with the cooling indicated generally by arrow 62 in the manner well known in the MRI art, resulting in boiling of helium liquid 46 and production of helium gas 40 above helium surface level 44. However, helium gas 40 instead of being vented to the surrounding atmosphere 37 as is common in many MRI equipments, flows through gas passageway 52 in wall 53 of helium pressure vessel 4, and through helium gas passage 50 to the interior of helium recondensing chamber 38 to pass between cryocooler cooled heat transfer plates 42 to recondense back to liquid helium. The recondensed liquid helium drops to bottom region 48 of the helium recondensing chamber 38 where it collects and flows by gravity through helium return line 54 and liquid helium passageway 58 through helium vessel 4 back to liquid helium supply 46, thus returning the recondensed helium gas back to the liquid helium supply as liquid helium.

In addition to cooling radiation shield 6 by first stage 16 of cryocooler 12, superinsulation 34 is provided in the space between radiation shield 6 and vacuum vessel 2 to further thermally isolate helium vessel 4 from vacuum vessel 2. Superinsulation 35 is also provided between recondensing chamber 38 and helium vessel 4 to thermally isolate the recondensing chamber 38 during servicing of cryocooler 12 which warms up cryocooler sleeve 13. Superinsulation 34 and 35 is aluminized Mylar multi-layer insulation used in the superconducting magnet industry.

However, the above zero boil-off design with a single radiation thermal shield 6 allows a temperature thereof to increase to temperatures of about 100° K. to about 150° K. when the coldhead is not functioning, due to power off, coldhead failure or transportation. The coldhead acts as a heat source and adds significant heat into the cryostat when the coldhead is not functioning. Conductance of copper braids 22, 24 between the coldhead sleeve assembly and thermal shield 6 allow heat from the coldhead to heat the single radiation thermal shield 6. The radiation heat between coldhead 12 and helium vessel 4 attributes to most of the total head load, thus allowing boil-off of the helium.

Figure 2:
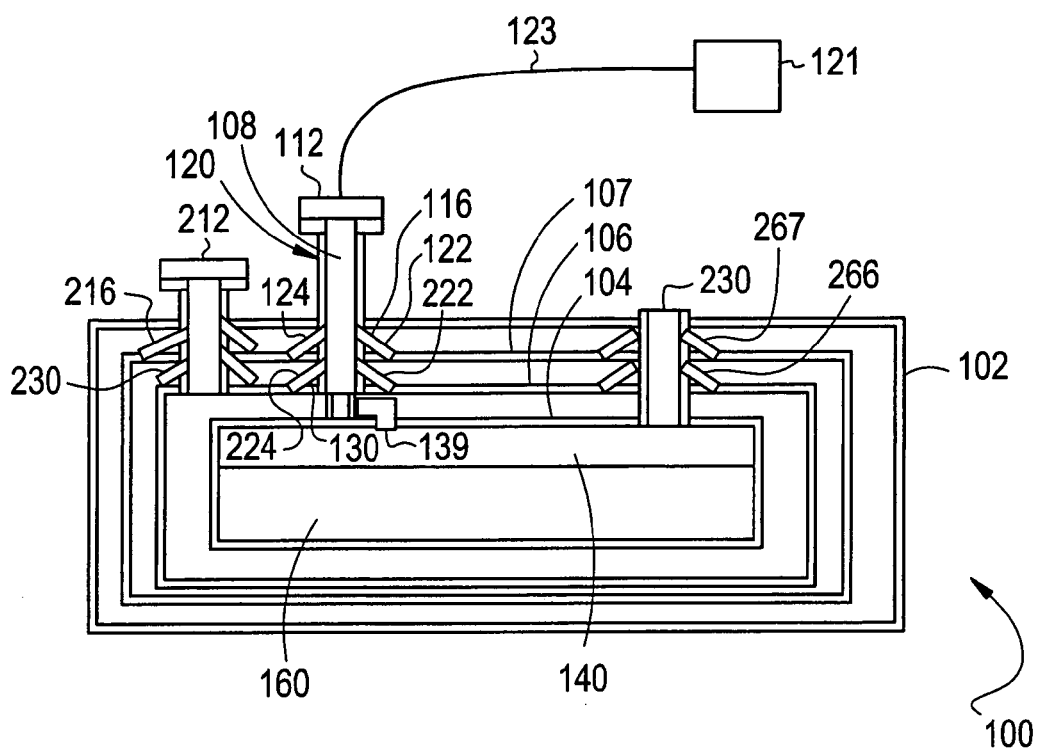
FIG. 2 is a cross section view of a MRI superconducting magnet shown in simplified form incorporating a plurality of radiation thermal shields, a double stage coldhead, a three stage coldhead, and thermally isolated penetration in accordance with an exemplary embodiment.

FIG. 2 illustrates a MRI magnet system 100 having a plurality of radiation thermal shields in accordance with an exemplary embodiment. In theory, by adding more radiation thermal shields, the radiation heat load is reduced and less helium will boil-off. MRI magnet system 100 includes helium pressure vessel 104 including a liquid cryogen 160 such as helium surrounded by vacuum vessel 102 with thermally isolating radiation shields 106 and 107 interposed between the helium vessel and the vacuum vessel. A first cryocooler 112 (which may be a Gifford-Mahon cryocooler) extends through vacuum vessel 102 within a sleeve 108 such that the cold end of the cryocooler may be selectively positioned within the sleeve 108 without destroying the vacuum within vacuum vessel 102, and heat generated by a motor (not shown) of the cryocooler 112 is outside the vacuum vessel. Cryocooler 112 is installed in a cryocooler sleeve assembly 120 similar to the cryocooler sleeve assembly 8, 18, 23 described with respect to FIG. 1. A compressor 121 is in operable communication with cryocooler 112 via line 123 for providing pressurized helium gas 140 to a cold end.

Cryocooler 112 as illustrated may be a three stage coldhead having a first stage heat station 116 thermal contacting radiation shield 107 through braided copper flexible couplings 122 and 124. Cryocooler 112 further includes a second stage heat station 130 thermal contacting radiation shield 106 through braided copper flexible couplings 222 and 224. Lastly, a third stage of cryocooler 112 includes a recondensor 139 in fluid communication with cryogen liquid 160 in pressure vessel 104.

Still referring to FIG. 2, MRI magnet system 100 optionally includes a second cryocooler 212. Cryocooler 212 as illustrated is a two stage cold head having a first stage heat station 216 thermal contacting radiation shield 107 through a corresponding set of braided copper flexible couplings 122 and 124. Cryocooler 212 further includes a second stage heat station 130 thermal contacting radiation shield 106 through a corresponding set of braided copper flexible couplings 222 and 224. It will be noted that the most probable type of failure of two or three stage coldheads involves compressor stoppage due to loss of helium, loss of compressor cooling, motor failure, or power outage.

After the coldhead is off due to any of the reasons as stated above, the temperature on the high temperature thermal shield 107 will be close to the temperature on the single thermal shield design of FIG. 1. However, the temperature on the low temperature thermal shield 106 will be significantly lower. The radiation heat load between the low temperature thermal shield 106 to pressure vessel 104 will be reduced, and thus, the boil-off rate will be reduced relative to the single thermal shield design of FIG. 1.

Since it is necessary to provide electrical energy to the main magnet coil and to various collection coils employed in MRI magnet system 100, it is necessary that there be at least one penetration through the cryostat walls. A penetration 230 is shown thermally isolated from either of the cryocoolers 112, 212 in FIG. 2. Penetration 230 includes a thermal link with first and second radiation thermal shields 107 and 106 through braided copper flexible couplings 267 and 266, respectively.

Historically, the penetration heat station was attached to a coldhead sleeve, thus the coldhead would cool down the penetration during normal operation. However, if the coldhead fails to work properly or turns off, the coldhead would add significant heat to penetration. In exemplary embodiments depicted in FIGS. 2 and 3, the penetration heat station is attached to each thermal shield 106, 107 and remote from coldheads 112 and 212. In this manner, penetration heat station is isolated from coldhead during a power off or failure condition of either coldhead 112, 212.

Figure 3:
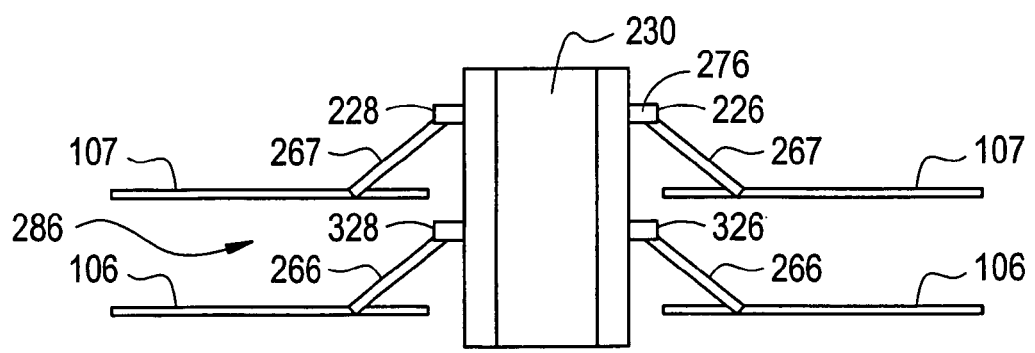
FIG. 3 is a cross section view of the penetration of FIG. 2 illustrating thermal links between penetration stations extending from the penetration and respective radiation thermal shields.

Referring now to FIG. 3, penetration 230 is shown more clearly with respect to thermal interfaces with radiation thermal shields 106 and 107, via couplings 266, 266, respectively. Penetration 230 extends through shields 106 and 107 while penetration 230 includes a first penetration heat station 276 defined by copper thermal blocks 226 and 228 in thermal communication with an outside surface defining penetration 230. Penetration 230 includes a second penetration heat station 286 defined by copper thermal blocks 326 and 328 in thermal communication with an outside surface defining penetration 230. Blocks 226 and 228 form a continuous annular ring disposed about penetration 230 that connects with braided copper flexible coupling, while blocks 326 and 328 also form a continuous annular ring disposed about penetration 230 that connects with braided copper flexible coupling 266 in an exemplary embodiment. Flexible couplings 266 and 267 also provide mechanical or vibration isolation between thermal shields 106 and 107.

Referring now to FIG. 4, a plumbing system 300 is schematically illustrated. Plumbing system 300 is configured to allow exhausted cryogen gas 140 carried sensible heat from pressure vessel 104 to cool down thermal shields 106, 107, penetration 230 and coldhead sleeves associated with cryocoolers 112, 212. More specifically, helium gas 140 from pressure vessel 104 generally indicated at 302 is diverted to pass through a coldhead sleeve 304, through thermal shields 106, 107 at 306, and pass through penetration 230 at 308. Exhausted gas proceeds to a pressure relief valve 310 via line 312 and exits pressure relief valve 310 out to vent line 314. In this manner, boiloff can be reduced by using the sensible heat in the exhausted gas 302 to cool the various components, thus reducing heat loads therebetween.

Plumbing system includes tubing 320 in fluid communication with exhausted helium gas from pressure vessel 104 with specific reference to FIGS. 2 and 4. FIG. 4 illustrates radiation thermal shield 106 with tubing 320 disposed about a circumferential periphery thereof. In an exemplary embodiment as shown, tubing 320 is copper while transition tubing from one component to another (e.g., one thermal shield 106 to another thermal shield 107) is made of a thermally non conductive material such as, stainless steel, or example. The stainless steel transition tubing connects copper tubing 320 between first and second thermal shields 107 and 106 in order to reduce the conduction heat load therethrough during normal operation of coldheads 112 and 212.

Referring now to FIG. 6, copper tubing 320 is mounted onto an outer surface of coldhead sleeve 120 and exhausted helium gas 140 will be allowed to pass through the tubing 320 mounted on the coldhead sleeve before it escapes to venting pipe 314. The sensible heat contained therein cools down the sleeve or coldhead in the process.

As disclosed, some embodiments of the invention may include some of the following advantages: reduction of helium boil-off during power off, coldhead failure and transportation by reducing radiation heat load using a plurality of radiation shields and thermally isolating penetration from a coldhead; and cooling of the thermal shields, coldhead sleeve and penetration by the sensible heat from the additional helium boil-off, while reducing conduction between the thermal shields during normal operation using a low conductive tubing to exhaust cryogen gas therebetween.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

The invention claimed is:

1. A zero boiloff cryogen cooled recondensing superconducting magnet assembly including superconducting magnet coils suitable for magnetic resonance imaging comprising:
    a cryogen pressure vessel to contain a liquid cryogen reservoir to provide cryogenic temperatures to said magnet coils for superconducting operation;
    a vacuum vessel surrounding said pressure vessel and spaced from said pressure vessel;
    a first thermal shield surrounding said pressure vessel and spaced from said pressure vessel;
    a second thermal shield surrounding said first thermal shield and spaced from said first thermal shield, said second thermal shield intermediate said vacuum vessel and said first shield;
    a cryocooler thermally connected by a first and a second thermal interface to said first and second thermal shields, respectively;
    a recondenser positioned in the space between said pressure vessel and said first thermal shield and thermally connected by a thermal interface to said cryocooler to recondense, back to liquid, cryogen gas provided from said pressure vessel; and
    means for returning the recondensed liquid cryogen to said pressure vessel;
    wherein said second thermal shield surrounding said first thermal shield reduces a radiation heat load from said first thermal shield to said pressure vessel lowering boiloff of cryogen gas under conditions of failure or power off of said cryocooler, and
    wherein sensible heat from said boiloff of cryogen gas cools down a coldhead sleeve of said coldhead, said penetration and said first and second thermal shields.

2. The zero boiloff superconducting magnet of claim 1, wherein said cryocooler includes at least one of a single, double, and a three stage coldhead.

3. The zero boiloff superconducting magnet of claim 2 including a penetration extending through said vacuum vessel to said pressure vessel, said penetration remote from said coldhead so as to provide direct thermal isolation therefrom.

4. The zero boiloff superconducting magnet of claim 3 including a third thermal interface between said cryocooler and said recondenser.

5. The zero boiloff superconducting magnet of claim 4 including tubing disposed on at least one of said coldhead sleeve and respective said first and second thermal shields in fluid communication with said boiloff of cryogen gas, said tubing in further fluid communication with a pressure relief valve configured to selectively vent said boiloff of cryogen gas.

6. The zero boiloff superconducting magnet of claim 5, wherein said tubing includes copper tubing.

7. The zero boiloff superconducting magnet of claim 6, wherein said tubing in fluid communication between said first and second thermal shields includes a low conductive transition tubing in order to reduce conduction of heat load during normal operation of said coldhead.

8. The zero boiloff superconducting magnet of claim 7, wherein said low conductive tubing connects copper tubing disposed around each of said first and second thermal shields.

9. The zero boiloff superconducting magnet of claim 7, wherein said low conductive tubing is a low thermally conductive tubing including stainless steel transition tubing.

10. The zero boiloff superconducting magnet of claim 3, wherein said penetration includes a first penetration station and a second penetration station thermally connected by first and second penetration thermal interfaces to said first and second thermal shields, respectively.

11. A method to reduce boiloff rate of cryogen gas during a coldhead failure or power off condition in a zero boiloff cryogen cooled recondensing superconducting magnet assembly including superconducting magnet coils suitable for magnetic resonance imaging, the method comprising:
    disposing a liquid cryogen in a cryogen pressure vessel to provide cryogenic temperatures to said magnet coils for superconducting operation;
    surrounding said pressure vessel with a vacuum vessel spaced from said pressure vessel;
    surrounding said pressure vessel with a first thermal shield spaced from said pressure vessel;
    surrounding said first thermal shield with a second thermal shield spaced from said first thermal shield, said second thermal shield intermediate said vacuum vessel and said first shield;
    thermally connecting a cryocooler by a first and a second thermal interface to said first and second thermal shields, respectively;
    positioning a recondenser in the space between said pressure vessel and said first thermal shield and thermally connected by a thermal interface to said cryocooler to recondense, back to liquid, cryogen gas provided from said pressure vessel; and returning the recondensed liquid cryogen to said pressure vessel;

wherein said second thermal shield surrounding said first thermal shield reduces a radiation heat load from said first thermal shield to said pressure vessel lowering boiloff of cryogen gas under conditions of failure or power off of said cryocooler, and wherein sensible heat from said boiloff of cryogen gas cools down a coldhead sleeve of said cryocooler and said first and second thermal shields.

12. The method of claim 11, wherein said cryocooler includes at least one of a single, double, and a three stage coldhead.

13. The method of claim 12 further comprising:
disposing a penetration extending through said vacuum vessel to said pressure vessel, said penetration remote from said coldhead so as to provide direct thermal isolation therefrom.

14. The method of claim 13 including a third thermal interface between said cryocooler and said recondenser, and wherein sensible heat from said boiloff of cryogen gas cools down the coldhead sleeve of said coldhead, said penetration, and said first and second thermal shields.

15. The method of claim 14 further comprising:
disposing tubing on at least one of said coldhead sleeve and respective said first and second thermal shields in fluid communication with said boiloff of cryogen gas, said tubing in further fluid communication with a pressure relief valve configured to selectively vent said boiloff of cryogen gas.

16. The method of claim 15, wherein said tubing includes copper tubing in fluid communication between said first and second thermal shields, said tubing including a low conductive transition tubing in order to reduce conduction of heat load during normal operation of said coldhead, said low conductive tubing connecting copper tubing disposed around each of said first and second thermal shields.

17. The method of claim 13, wherein said penetration includes a first penetration station and a second penetration station thermally connected by first and second penetration thermal interfaces to said first and second thermal shields, respectively.

18. A zero boiloff liquid helium cooled recondensing superconducting magnet assembly suitable for magnetic resonance imaging comprising:
a helium pressure vessel to contain a liquid helium reservoir to provide cryogenic temperatures to said magnet resonance imaging magnet assembly for superconducting operation;
a vacuum vessel surrounding said pressure vessel and spaced from said pressure vessel;
a first thermal shield surrounding said pressure vessel and spaced from said pressure vessel;
a second thermal shield surrounding said first thermal shield and spaced from said first thermal shield, said second thermal shield intermediate said vacuum vessel and said first shield; and a recondenser and a cryocooler for cooling said recondenser to recondense helium gas formed in said pressure vessel back to liquid helium, said cryocooler thermally connected by a first and a second thermal interface to said first and second thermal shields, respectively;

wherein said second thermal shield surrounding said first thermal shield reduces a radiation heat load from said first thermal shield to said pressure vessel lowering boiloff of helium gas under conditions of failure or power off of said cryocooler, and wherein sensible heat from boiloff of helium gas cools down a coldhead sleeve of said cryocooler and said first and second thermal shields.

19. The zero boiloff superconducting magnet of claim 18, wherein said cryocooler includes at least one of a single, double, and a three stage coldhead.

20. The zero boiloff superconducting magnet of claim 19 including a penetration extending through said vacuum vessel to said pressure vessel, said penetration remote from said coldhead so as to provide direct thermal isolation therefrom.

21. The zero boiloff superconducting magnet of claim 20 including a third thermal interface between said cryocooler and said recondenser, and wherein sensible heat from said boiloff of helium gas cools down the coldhead sleeve of said coldhead, said penetration, and said first and second thermal shields.

22. The zero boiloff superconducting magnet of claim 21 including tubing disposed on at least one of said coldhead sleeve and respective said first and second thermal shields in fluid communication with said boiloff of helium gas, said tubing in further fluid communication with a pressure relief valve configured to selectively vent said boiloff of helium gas.

23. The zero boiloff superconducting magnet of claim 22, wherein said tubing includes copper tubing in fluid communication between said first and second thermal shields, said tubing including a low conductive transition tubing in order to reduce conduction of heat load during normal operation of said coldhead, said low conductive tubing connecting copper tubing disposed around each of said first and second thermal shields.

24. The zero boiloff superconducting magnet of claim 20, wherein said penetration includes a first penetration station and a second penetration station thermally connected by first and second penetration thermal interfaces to said first and second thermal shields, respectively.

* * * * *